(12) United States Patent
Hannah

(10) Patent No.: US 7,746,689 B2
(45) Date of Patent: Jun. 29, 2010

(54) MOLECULAR QUANTUM MEMORY

(75) Inventor: Eric C. Hannah, Pebble Beach, CA (US)

(73) Assignee: Intel Corporation, Santa Clara, CA (US)

( * ) Notice: Subject to any disclaimer, the term of this patent is extended or adjusted under 35 U.S.C. 154(b) by 628 days.

(21) Appl. No.: 11/291,802

(22) Filed: Nov. 30, 2005

(65) Prior Publication Data

US 2007/0126436 A1   Jun. 7, 2007

(51) Int. Cl.
*G11C 11/14* (2006.01)
(52) U.S. Cl. .................................... 365/171; 365/118
(58) Field of Classification Search ................. 365/158, 365/118, 171, 173
See application file for complete search history.

(56) References Cited

U.S. PATENT DOCUMENTS

| | | | |
|---|---|---|---|
| 5,940,314 A | 8/1999 | Suzuki et al. | |
| 5,940,802 A | 8/1999 | Suzuki et al. | |
| 6,061,265 A | 5/2000 | Hannah | |
| 6,304,481 B1 * | 10/2001 | Hurt | 365/118 |
| 6,388,912 B1 | 5/2002 | Hannah et al. | |
| 6,625,052 B2 | 9/2003 | Hannah et al. | |
| 6,639,832 B2 | 10/2003 | Hannah et al. | |
| 6,643,161 B2 | 11/2003 | Hannah et al. | |
| 6,741,496 B2 | 5/2004 | Hannah et al. | |
| 6,870,762 B2 | 3/2005 | Hannah et al. | |
| 6,912,148 B2 | 6/2005 | Hannah et al. | |
| 7,068,452 B2 * | 6/2006 | Ogawa et al. | 360/55 |
| 2004/0100820 A1 * | 5/2004 | Hannah et al. | 365/173 |
| 2004/0165482 A1 * | 8/2004 | Kim | 369/13.01 |
| 2004/0228024 A1 * | 11/2004 | Ogawa et al. | 360/69 |
| 2005/0128886 A1 * | 6/2005 | Ogawa et al. | 369/13.33 |
| 2005/0162888 A1 | 7/2005 | Hannah et al. | |
| 2006/0138502 A1 * | 6/2006 | Sugahara et al. | 257/295 |

FOREIGN PATENT DOCUMENTS

| | | |
|---|---|---|
| EP | 0 591 595 A1 | 4/1994 |
| EP | 0591595 | 4/1994 |

OTHER PUBLICATIONS

D Gatteschi and R Sessoli, "Quantum Tunneling of Magnetization and Related Phenomena in Molecular Materials" Angewandte Chemie, International Edition, vol. 42, Issue 3, pp. 268-297, Published Online: Jan. 20, 2003.*

(Continued)

*Primary Examiner*—Van Thu Nguyen
*Assistant Examiner*—Douglas King
(74) *Attorney, Agent, or Firm*—Blakely, Sokoloff, Taylor & Zafman LLP

(57) ABSTRACT

Apparatus, systems and methods for implementing molecular quantum memory are disclosed. In one implementation, a source of polarized electrons and a source of oppositely polarized electrons may be selectively coupled to at least one probe tip of a probe assembly. The at least one probe tip may, in turn, be electrically coupled to a molecule so that information may be written to the molecule using a time-varying polarized electron current selectively derived from the polarized electron current sources.

13 Claims, 3 Drawing Sheets

OTHER PUBLICATIONS

S Bandyopadhyay, B Das, and A E Miller "Supercomputing with spin-polarized single electrons in a quantum coupled architecture", Nanotechnology 5, 113 (1994).*

Pending U.S. Appl. No. 09/706,502, filed Nov. 2, 2000; Inventor: Hannah.

Pending U.S. Appl. No. 11/051,311, filed Feb. 3, 2005; Inventor: Hannah et al.

Khitrin et al: Nuclear Magnetic Resonance Molecular Photography; Journal of Chemical Physics vol. 117, No. 15; Oct. 15, 2002; 4 pages.

Leuenberger et al: Quantum Computing in Molecular Magnets; Nature vol. 410; Apr. 12, 2001; pp. 789-793.

Barre et al: High-Frequency EPR Spectra of a Molecular Nanomagnet: Understanding Quantum Tunneling of the Magnetization; The American Physical Society, Physical Review B, vol. 56, No. 13; Oct. 1, 1997; pp. 8192-8198.

Van Leuken et al: Half-Metallic Antiferromagnets;The Americal Physical Society, Physical Review Letters, vol. 74, No. 7; Feb. 13, 1995; pp. 1171-1173.

Mertes et al: Mn12-acetate: A Prototypical Single Molecule Magnet; Solid State Communication 127 (2003); pp. 131-139.

R. N. Gurzhi et al., "A Magnetic-Field-Effect Transistor and Spin Transport", Applied Physics Letters, vol. 83, No. 22, Dec. 1, 2003.

IBM Technical Disclosure, "Information Storage with Scanning Tunneling Microscope ", IBM Corporation, vol. 32, No. 2, Jul. 1989.

A. Corina et al., "Direct Observation of Single-Molecule Magnets Organized on Gold Surfaces", Angewandte Chemie Int. Ed. 2003, 42.

"International Preliminary Report on Patentability and Written Opinion", International Application No. PCT/US2006/045141; Mailed Nov. 30, 2005, (Jun. 3, 2008), 7 pages.

"International Search Report", International Application No. PCT/US2006/045141; mailed May 25, 2007, 3 pages.

Cornia, Andrea, et al., "Direct Observation of Single-Molecule Magnets Organized on Gold Surfaces", Database Compendex Engineering Information, Inc., International Edition, vol. 42, No. 14, Apr. 11, 2003, 1645-1648.

EPO, "Office Action", European Patent Application No. 06 844 492.6-2210; Mailed Nov. 3, 2008, 1 page.

Gurzhi, R. N., et al., "A Magnetic-Field-Effect Transistor and Spin Transport", Applied Physics Letters, AIP, American Institute of Physics, Melville, NY, US, vol. 83, No. 22, (Dec. 1, 2003), 4577-4579.

IBM, "Information Storage with Scanning Tunneling Microscope", IBM Technical Disclosure Bulletin, IBM Corp., New York, US, Vol. 32, No. 2, Jul. 1, 2989, (Jul. 1, 1989), 285-286.

"Office Action", Application No. 95143044, Office action Mailed Sep. 8, 2009, 11 pages.

* cited by examiner

MOLECULAR QUANTUM MEMORY

BACKGROUND

Typical magnetic memory devices utilize strong magnetic fields produced by imbedded conductors to manipulate magnetic domains in the memory element material. Frequently the material used to form magnetic memory devices, such as magnetic random access memory (MRAM), responds in a bulk fashion to these strong magnetic fields. The use of magnetic field coupling and bulk ferromagnetic memory material limits the practical application of MRAM. On the other hand, molecular memory materials, including those molecules in which multiple magnetic memory states can be selectively addressed using spin-state transitions, present an attractive alternative to MRAM devices. However, while molecular memory nuclear spin states may be addressed using nuclear magnetic resonance (NMR), such an approach requires large magnetic fields and radio frequency (RF) excitation techniques.

BRIEF DESCRIPTION OF THE DRAWINGS

The accompanying drawings, which are incorporated in and constitute a part of this specification, illustrate one or more implementations consistent with the principles of the invention and, together with the description, explain such implementations. The drawings are not necessarily to scale, the emphasis instead being placed upon illustrating the principles of the invention. In the drawings.

DETAILED DESCRIPTION

The following detailed description refers to the accompanying drawings. The same reference numbers may be used in different drawings to identify the same or similar elements. In the following description specific details may be set forth such as particular structures, architectures, interfaces, techniques, etc. in order to provide a thorough understanding of the various aspects of the claimed invention. However, such details are provided for purposes of explanation and should not be viewed as limiting with respect to the claimed invention. With benefit of the present disclosure it will be apparent to those skilled in the art that the various aspects of the invention claimed may be practiced in other examples that depart from these specific details. Moreover, in certain instances, descriptions of well known devices, circuits, and methods are omitted so as not to obscure the description of the present invention with unnecessary detail.

Figure 1A:
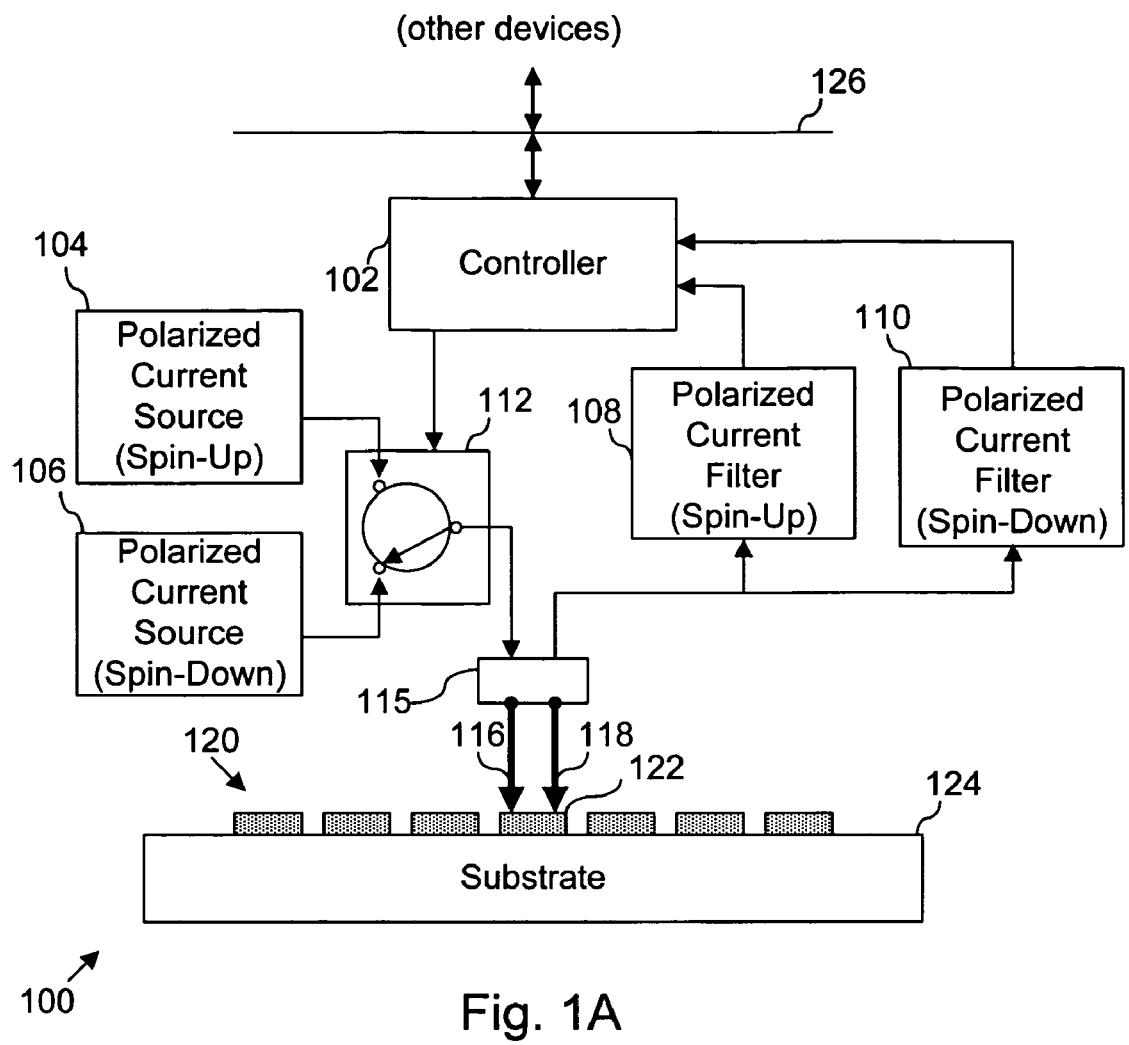
FIG. 1A illustrates an example system suitable for implementing molecular quantum memory.

FIG. 1A illustrates an example system 100 in accordance with one implementation of the invention. System 100 includes a controller 102, polarized electron current sources 104 and 106, polarized electron current filters 108 and 110, switch 112, scanning probe assembly 115, scanning probes 116 and 118, an array 120 of single molecule magnets (SMMs) 122, a substrate 124, and a shared bus or other communications pathway 126 coupling controller 102 to other devices (not shown) external to system 100 thereby permitting information and/or data to flow to and/or from controller 102.

System 100 may assume a variety of physical manifestations suitable for implementation of molecular quantum memory in accordance with the invention. For example, system 100 may be implemented within a memory device such as a dynamic random access memory (DRAM) device, or a static random access memory (SRAM) device (e.g., a fast cache or cache accelerator memory device). Alternatively, system 100 may be implemented within a data storage device such as a hard drive (HD). However, as those skilled in the art will recognize, the labels "memory device" and/or "data storage device" are somewhat arbitrary and may be used interchangeably without departing from the scope or spirit of the invention. Clearly, the invention is not limited with respect to how implementations of system 100 may be characterized in this regard. In addition, those skilled in the art will recognize that system 100 may be merely a schematic representation and may not be illustrated to scale. Moreover, certain features of system 100 or elements thereof not particularly relevant to the invention have been excluded from FIG. 1 so as to not obscure the invention.

Controller 102 may be, in various implementations, any control and/or processing logic and/or collection of devices including such logic that is/are capable of control and/or processing functions suitable for implementation of molecular quantum memory in accordance with the invention as will be describe in greater detail below. For example, controller 102 may comprise control logic implemented in the form of a discrete controller integrated circuit (IC) or a micro-controller IC to name a few possibilities. However, the invention is not limited in this regard and controller 102 may be implemented in a general purpose processor, and/or application specific IC (ASIC) to name a few other examples. Moreover, controller 102 may comprise a single device (e.g., a microprocessor IC) or may comprise multiple devices (e.g., a packaged collection of logic ICs).

In one implementation, controller 102 may be capable of performing any of a number of tasks that support implementation of molecular quantum memory. These tasks may include, for example, although the invention is not limited in this regard, converting digital information (e.g., binary data) into a variable-frequency switching pattern through appropriate control signals applied to switch 112, sources 104/106, and/or filters 108/110. Controller 102 may also provide scanning control for probes 116/118. In one implementation, elements 104-124 of system 100 may reside in a discrete device such as a DRAM device while controller 102 may be distinct from, yet coupled to, that device. In such an arrangement controller 102 may be described as a memory and/or hard disk controller and/or control logic although, of course, the label applied to controller 102 is not limiting with respect to the claimed invention.

Polarized electron current sources 104 and 106 may comprise any devices and/or materials capable of generating and/or providing polarized electron currents. While source 104 is labeled as a source of spin-up polarized current and source 106 is labeled as a source of spin-down polarized current these labels are an arbitrary convention assumed solely for the purposes of discussion of system 100 to follow below. Those skilled in the art will recognize that sources 104 and 106 could as readily be labeled respectively as spin-down and spin-up sources without departing from the scope and spirit of the invention.

In one implementation source 104 may include a half-metal material suitable for providing a current of spin-up polarized electrons while source 106 may include a different half-metal material suitable for providing a current of spin-down polarized electrons. Half-metal materials are a known class of ferromagnetic materials where, as a result of ferromagnetic decoupling, only one of two molecular electron spin sub-bands has an appreciable state density at the Fermi level leading to substantially complete carrier electron spin polarization. Among known half-metals are the "zinc-blende" compounds such as MnAs and CrAs, the "semi-Heusler phases" such as NiMnSb and PtMnSb, the "mixed valence perovskites" such as $La_{0.70}Sr_{0.30}MnO_3$ and $Fe_3O_4$, as well as the binary oxide $CrO_2$, to name a few examples. Half-metal materials may be synthesized in bulk crystalline form or may be formed as thin layers of molecules on a variety of substrates including silicon substrates. As those skilled in the art will recognize, half-metal materials may be used to form controllable electron current sources with substantially complete spin polarization.

However, while sources 104 and 106 may utilize half-metal materials, the invention is not limited in this regard and those skilled in the art will recognize that other ferromagnetic materials may be utilized in sources 104 and 106 to provide polarized electron currents. For example, ferromagnetic single crystal Ni<110> wire is known to provide polarized electron currents.

Polarized electron current filters 108 and 110 may comprise any devices and/or materials capable of conducting and/or conveying electron currents of only one polarity. In other words current filters 108 and 110 may comprise any devices and/or materials capable of filtering out electron currents having a particular polarization. While filter 108 is labeled as a filter of spin-up polarized current (i.e., filter 108 conducts spin-down current) and filter 110 is labeled as a filter of spin-down polarized current (i.e., filter 110 conducts spin-up current) these labels are an arbitrary convention assumed solely for the purposes of discussion of system 100 to follow below. Thus, similar to the discussion above regarding sources 104 and 106, those skilled in the art will recognize that filters 108 and 110 could as readily be labeled respectively as spin-down and spin-up filters without departing from the scope and spirit of the invention.

In one implementation filter 108 may include a half-metal material suitable for filtering out spin-up electron current (i.e., suitable for conducting substantially only spin-down electron current) while filter 110 may include a different half-metal material suitable for filtering out spin-down electron current (i.e., suitable for conducting substantially only spin-up electron current). As those skilled in the art will recognize, half-metal materials may be used to form controllable electron current filters with substantially complete spin polarization characteristics.

However, while filters 108 and 110 may utilize half-metal materials, the invention is not limited in this regard and those skilled in the art will recognize that other materials may also be used in filters 108 and 110 to provide polarized electron current filtering capabilities. For example, ferromagnetic single crystal Ni<110> wire is known to conduct electron currents of only one polarity. Switch 112 may comprise any device and/or mechanism capable of rapidly switching between conducting and/or conveying electron currents of only one polarity to conducting and/or conveying electron currents of the other polarity.

Probe assembly 115 may comprise any device(s) and/or mechanism(s) capable of conveying polarized electron currents to or from probes 116 and 118. In one implementation, assembly 115 may incorporate some mechanisms similar to those found in conventional scanning, tunneling microscope (STM) probe assemblies such that assembly 115 may be capable of scanning probes 116 and 118 over and/or across SMMs 122 of array 120. While FIG. 1 shows probe assembly 115 as not including items 104-112 the invention is not limited to the implementation shown in FIG. 1 and items 104-112 could just as well be included in probe assembly 115. Similarly, controller 102 may be included in probe assembly 115.

Probes 116 and 118 may be capable of conveying polarized electron currents to or from SMMs 122. That is, probes 116 and 118 may be capable of maintaining a spatial orientation with respect to SMMs 122 of array 120 such that electron current tunneling may take place between probes 116/118 and SMMs 122 while probes 116/118 are scanned over and/or across array 120 as will be discussed in greater detail below. Techniques for interacting STM probes with solid-state materials with are well known.

Array 120 of SMMs 122 may comprise any suitable array of SMMs 122. For example, array 120 may comprise a monolayer of SMMs deposited using conventional deposition techniques. SMMs 122 may comprise one of a variety of molecular compounds well known to exhibit substantial electron spin ground states and magnetic hysteresis cycles similar to that of bulk ferromagnets. In either bulk or layer form, stronger intramolecular exchange forces between electron spins within individual SMMs dominate over weaker intermolecular magnetic coupling. Although the molecules of array 120 are labeled as SMMs 122, those skilled in the art will recognize that any molecules exhibiting substantial electron spin ground states and magnetic hysteresis cycles similar to that of bulk ferromagnets may, in accordance with the invention, be used to form array 120 whether or not those molecules are recognized, described and/or labeled as SMMs.

In one implementation, each SMM 122 may comprise a cluster compound having twelve Manganese ions, $Mn_{12}O_{12}(CH_3COO)_{16}(H_2O)_4$ (often and hereinafter referred to as "$Mn_{12}$"). $Mn_{12}$ may be considered as having an electron spin S=10 ground state arising from the combination of eight Mn(III) atoms each bearing 2 units of spin-up electron spin momentum and four Mn(IV) atoms each bearing 3/2 units of spin-down electron spin momentum. Stable monolayers of $Mn_{12}$ molecules may be deposited directly onto substrates using standard techniques such as molecular beam epitaxy to yield arrays of magnetically-independent SMMs such as array 120. However, the invention is not limited to a particular type of SMM and those skilled in the art will recognize that SMMs 122 may comprise other molecular compounds that exhibit suitable electron spin ground states and magnetic hysteresis. Other SMMs including transition-metal ions such as Fe, V, Cr and Co are well characterized. Moreover, as will be discussed in greater detail below, individual SMMs such as any one of SMMs 122 may be controllably generated in one of the 2S+1 spin eigenstates corresponding to quantized projections <m> of the molecular spin S.

Controllable generation of individual SMMs having specific internal spin states may enable the storage of information. For example, it is well recognized that individual SMMs such as $Mn_{12}$ may exhibit 2S−1 unique excited spin states labeled by the projection of the projection <m> of the molecular spin quantum number S on the primary molecular symmetry axis. Thus, for example, each $Mn_{12}$ SMM may exhibit 2S−1=2(10)−1=19 unique excited spin states. In accordance with the invention, and as will be explained in greater detail below, each SMM (e.g., each SMM 122) may be controllably prepared using polarized electrons in the form of a time-varying polarized current waveform (PCW) such that one or more of these excited spin states may be populated.

Figure 1B:
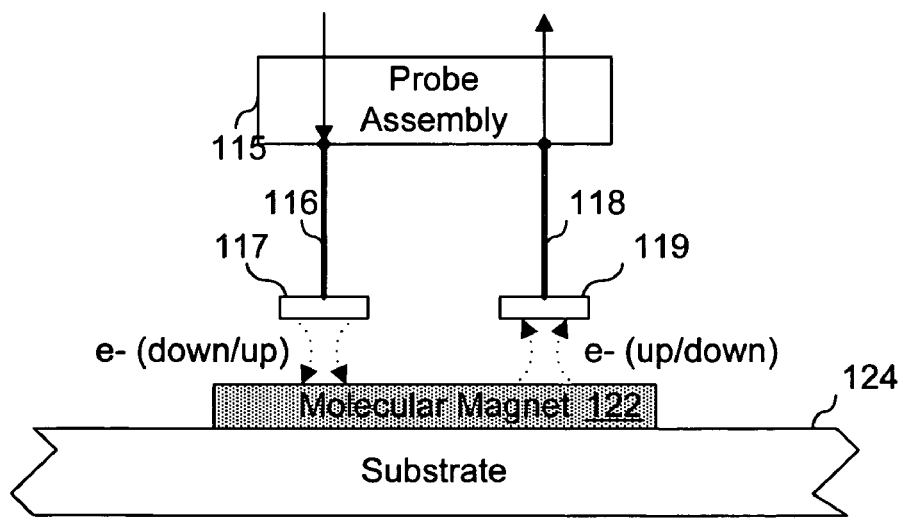
FIG. 1B illustrates portions of the system of FIG. 1A in greater detail.

FIG. 1B illustrates portions of system 100 in greater detail including assembly 115, probes 116/118 and one SMM 122. As discussed above, assembly 115 may position probes 116 and 118 over individual SMMs 122 so that respective probe tips 117 and 119 may convey polarized electron currents to and/or from the SMMs via tunneling.

Figure 2A:
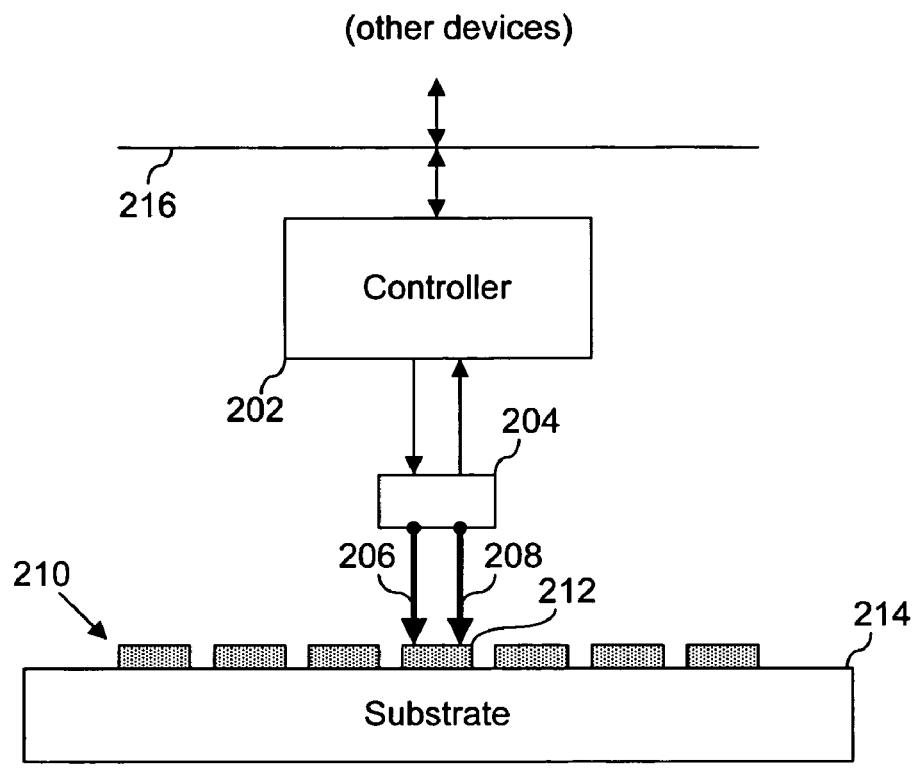
FIG. 2A illustrates an example of another system suitable for implementing molecular quantum memory.
Figure 2B:
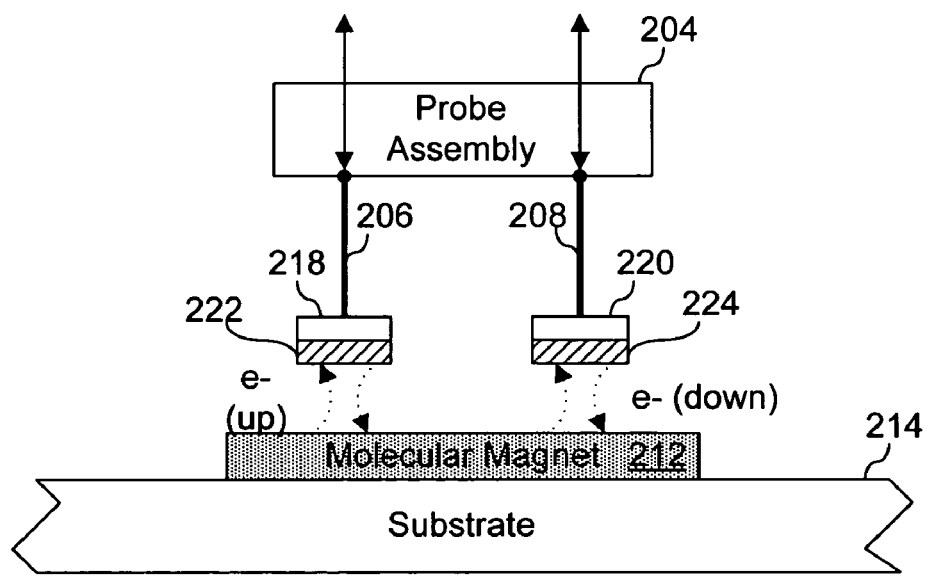
FIG. 2B illustrates portions of the system of FIG. 2A in greater detail.

FIG. 2A illustrates a system 200 in accordance with another implementation of the invention while FIG. 2B illustrates portions of system 200 in greater detail. System 200 includes a controller 202, a scanning probe assembly 204, scanning probes 206 and 208, an array 210 of single molecule magnets (SMMs) 212, a substrate 214, and a shared bus or other communications pathway 216 coupling controller 202 to other devices (not shown) external to system 200 thereby permitting information and/or data to flow to and/or from controller 202. As shown in FIG. 2B, probes 206 and 208 have respective tips 218 and 220 that include respective contacts 222 and 224.

System 200 may assume a variety of physical manifestations suitable for implementation of molecular quantum memory in accordance with the invention. For example, similar to the discussion above with respect to system 100, system 200 may be implemented within a memory device such as a random access memory (RAM) device or a data storage device such as a hard drive (HD). However, as those skilled in the art will recognize, the labels "memory device" and/or "data storage device" are somewhat arbitrary and may be used interchangeably without departing from the scope or spirit of the invention. Clearly, the invention is not limited with respect to how implementations of system 200 may be characterized in this regard. In addition, those skilled in the art will recognize that system 200 may be merely a schematic representation and may not be illustrated to scale. In addition, certain features of system 200 or elements thereof not particularly relevant to the invention have been excluded from FIGS. 2A/B so as to not obscure the invention.

In one implementation, controller 202 may be capable of performing any of a number of tasks that support implementation of molecular quantum memory. These tasks may include, for example, although the invention is not limited in this regard, converting digital information (e.g., binary data) into a variable-frequency electron current supplied to probes 206 and/or 208. Controller 202 may also provide scanning control for probes 206/208. In one implementation, elements 204-214 of system 100 may reside in a discrete device such as a DRAM device or a hard drive device while controller 202 may be distinct from, yet coupled to, that device. In such an arrangement controller 202 may be described as a memory and/or hard disk controller and/or control logic although, of course, the label applied to controller 202 is not limiting with respect to the claimed invention. For example, controller 202 may comprise control logic implemented in the form of a discrete controller IC or a micro-controller IC to name a few possibilities. However, the invention is not limited in this regard and controller 202 may be implemented in a general purpose processor, and/or ASIC to name a few other examples. Moreover, controller 202 may comprise a single device (e.g., a microprocessor IC) or may comprise multiple devices (e.g., a packaged collection of logic ICs).

In contrast to system 100, contacts 222 and 224 of system 200 may emit and/or filter electron currents of opposite polarity. Thus, although the descriptive labels applied to contacts 222 and 224 in no way limit the invention, contacts 222 and 224 may be described as polarized current emitters. In other words, contact 222 may emit time-varying electron currents of a first polarity (e.g., "up" polarity) when probe 206 is supplied with a time-varying electron current by controller 202 (i.e., contact 222 may filter "down" polarized current out of that current supplied to probe 206 by controller 202). Likewise, contact 224 may emit time-varying electron currents of a second polarity (e.g., "down" polarity) when probe 208 is supplied with a time-varying electron current by controller 202 (i.e., contact 224 may filter "up" polarized current out of that current supplied to probe 208 by controller 202). Of course, as noted above with respect to system 100, the choice in describing contact 222 of system 200 as filtering out "down" polarized current and contact 224 as filtering out "up" polarized current is purely arbitrary.

In one implementation, contacts 222 and 224 include half-metal electron current materials capable of emitting and/or filtering substantially fully-polarized electron currents of opposite polarity respectively. In accordance with the invention, and as will be explained in greater detail below, each SMM (e.g., each SMM 122) may controllably prepared using polarized electrons in the form of a PCW emitted by probe contacts 222 and 224 such that one or more of the SMM's excited spin states may be populated.

Figure 3:
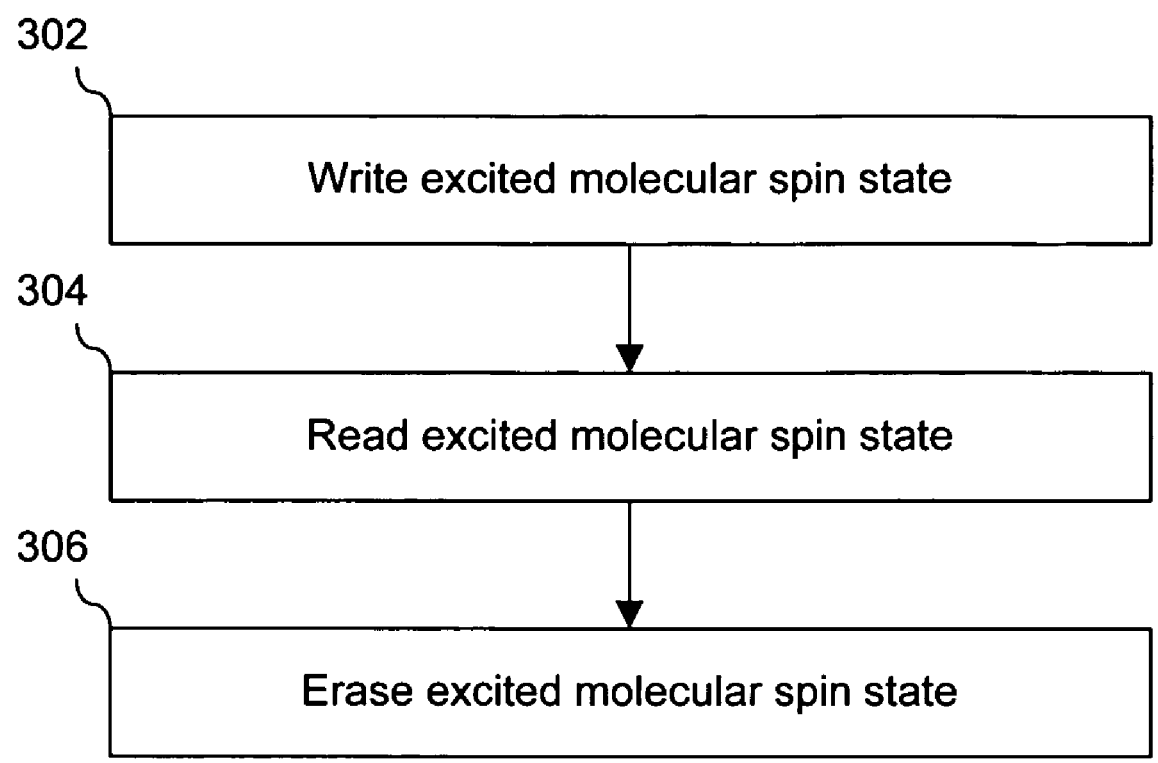
FIG. 3 is a flow chart illustrating an example process for implementing molecular quantum memory.

FIG. 3 is a flow diagram illustrating a process 300 for implementing molecular quantum memory in accordance with an implementation of the claimed invention. While, for ease of explanation, process 300, and associated processes, may be described with regard to system 100 of FIGS. 1A/B and/or system 200 of FIGS. 2A/B, the claimed invention is not limited in this regard and other processes or schemes supported and/or performed by appropriate devices and/or combinations of devices in accordance with the claimed invention are possible.

Process 300 may begin with the selective preparation or "writing" of a particular excited molecular spin state using a PCW [act 302]. The PCW used in act 302 may depend upon the nature of the molecular spin eigenstates. For example, the excited spin eigenstates of the SMM $Mn_{12}$ and the excitation scheme required to selectively prepare those states are well characterized. One way to implement act 302 is to have controller 102 of system 100 convert binary information into a time-varying modulation signal applied to switch 112 so as to supply a time-varying polarized electron current (i.e., PCW) to probe 116.

The PCW used in act 302 may include both spin-up and/or spin-down polarized electron current pulses of varying pulse widths. That PCW may then tunnel from probe tip 117 to SMM 122. Exposing SMM 122 to the PCW may set up an exchange interaction between the time-varying polarized electron current and the SMM molecular spin ground to yield an excited spin state in SMM 122. Because the exact nature of the PCW may be chosen to yield one or more excited SMM spin states, implementation of act 302 may allow for SMM 122 to be controllably generated in a specific information state. In other words, SMM 122 may be utilized to store information by undertaking act 302.

Another way to implement act 302 is to have controller 202 of system 200 provide a time-varying current to probes 206 and/or 208. As that current passes through contacts 222 and/or 224 the ferromagnetic half-metal materials in those contacts may filter the supplied current so that a time-varying polarized electron current (i.e., PCW) including both spin-up and/or spin-down polarized electron current pulses may be emitted from contacts 222 and/or 224. The resulting "write" PCW may include both polarization phases so that contacts 222 and/or 224 may supply both polarization components of the PCW to SMM 212. The resulting time-varying PCW may then tunnel from either probe contacts 222 and/or 224 into SMM 212 to controllably generate excited spin state(s) in the SMM in a manner similar to that described above.

While the invention is not limited to act 302 involving a particular PCW and a particular SMM, comprehension of act 302 may be facilitated by considering an example implementation where SMM 122 comprises $Mn_{12}$. In the case of $Mn_{12}$, as discussed above, nineteen excited spin states (spanning two spin manifolds) may be controllably and/or selectively populated by applying a coherent magnetic pulse having a discrete frequency spectrum to the SMM. Hence an arbitrary integer between 0 (i.e., corresponding to the SMM ground spin state) and 19 may be stored in the SMM. Well-known techniques may be used to convert a coherent magnetic pulse having a discrete frequency spectrum into a time-varying PCW suitable for use in act 302.

Process 300 may continue with a reading of the excited molecular spin state [act 304]. One way to do this is to collect polarized electron currents emitted from an SMM placed in an excited spin state by act 302 and exposed to another PCW in act 304. In one implementation, controller 102 of system 100 may modulate switch 112 to generate a PCW to interrogate the excited state(s) of SMM 122. That PCW may then, via tunneling and/or scattering between probe tip 117 and SMM 122, interact with SMM 122. Depending upon the particular excited spin states generated in SMM 122 by act 302 the resulting scattered current may have polarization-dependent amplitude variations. The polarization-dependent amplitudes of the current scattered off SMM 122 may be collected by tip 119 of probe 118 and supplied to filters 108 and 110. Controller 102 may analyze the output of filters 108/110 to determine the polarization state of SMM 122 and hence the information stored in SMM 122 in act 302. In this manner the arbitrary integer stored or "written" to SMM 122 in act 302 may be accessed or "read" in act 304.

Another way to implement act 304 is to have controller 202 of system 200 provide a time-varying current waveform to probes 206 and/or 208 thereby generating a PCW to interrogate the excited states of SMM 212. The interrogation PCW may include both polarization phases so that contacts 222 and/or 224 may supply both polarization components of the PCW to SMM 212. Interaction of the PCW with SMM 212 may generate polarized electron current scattered off of SMM 212 that can be filtered by tips 222 and/or 224 and analyzed by controller 202 to "read" the spin state of SMM 212. For example, the PCW may be composed of some current pulses having "up" polarization that are emitted by tip 222 and whose scattering amplitudes are detected or "filtered" by tip 224. Likewise, the PCW may also be composed of some current pulses having "down" polarization that are emitted by tip 224 and whose scattering amplitudes are detected or "filtered" by tip 222.

Process 300 may conclude with erasure of the excited molecular spin state [act 306]. One way to implement act 306 is to have controller 102 of system 100 provide a time-varying modulation signal applied to switch 112 so as to supply a time-varying polarized electron current (i.e., PCW) to probe 116. The PCW delivered to SMM 122 in act 306 may include both spin-up and/or spin-down polarized electron current pulses of varying pulse widths selected and/or prepared by controller 102 so as to return SMM 122 to its ground electron spin state. In other words, act 306 may be undertaken to place SMM 122 in a spin state suitable for implementation of another "write" action, such as act 302.

Another way to implement act 306 is to have controller 202 of system 200 provide a time-varying current to probes 206 and/or 208. The resulting "erase" PCW may include both polarization phases so that contacts 222 and/or 224 may supply both polarization components of the PCW to SMM 212. The resulting time-varying PCW may then tunnel from either probe contacts 222 and/or 224 into SMM 212 to controllably place SMM 212 in its spin ground state and/or a spin state suitable for further processing such as implementation of a new instantiation of process 300.

The acts shown in FIG. 3 need not be implemented in the order shown; nor do all of the acts necessarily need to be performed. Also, those acts that are not dependent on other acts may be performed in parallel with the other acts. Moreover, some acts of processes 300 may be implemented in and/or undertaken using hardware and/or firmware and/or software. However, the invention is not limited in this regard and acts that may be implemented in hardware and/or firmware may, alternatively, be implemented in software. Clearly, many such combinations of software and/or hardware and/or firmware implementation of process 300 may be contemplated consistent with the scope and spirit of the invention. Further, at least some of the acts in process 300 may be implemented as instructions, or groups of instructions, implemented in a machine-readable medium.

The foregoing description of one or more implementations consistent with the principles of the invention provides illustration and description, but is not intended to be exhaustive or to limit the scope of the invention to the precise form disclosed. Modifications and variations are possible in light of the above teachings or may be acquired from practice of various implementations of the invention. Clearly, many implementations may be employed to provide a method, apparatus and/or system to implement molecular quantum memory consistent with the claimed invention.

No element, act, or instruction used in the description of the present application should be construed as critical or essential to the invention unless explicitly described as such. Also, as used herein, the article "a" is intended to include one or more items. In addition, some terms used to describe implementations of the invention, such as "data" and "value," may be used interchangeably in some circumstances. For example, those skilled in the art will recognize that the terms polarization state and spin state may be used interchangeably without departing from the scope and spirit of the invention. Moreover, when terms such as "coupled" or "responsive" are used herein or in the claims that follow, these terms are meant to be interpreted broadly. For example, the phrase "coupled to" may refer to being communicatively, electrically and/or operatively coupled as appropriate for the context in which the phrase is used. Variations and modifications may be made to the above-described implementation(s) of the claimed invention without departing substantially from the spirit and principles of the invention. All such modifications and variations are intended to be included herein within the scope of this disclosure and protected by the following claims.

What is claimed is:

1. An apparatus comprising:
   a source of polarized electron current;
   a source of oppositely polarized electron current;
   a probe assembly including a first probe tip and a second probe tip, the first and the second probe tips electrically configured for selectively coupling with an individual molecule of an array of molecules; and
   a switch mechanism having a switch, the switch mechanism coupled with the first probe tip for applying a non-direct-current time-varying polarized electron current to the first probe tip by selectively coupling either the source of polarized electron current or the source of oppositely polarized electron current with the first probe tip.

2. The apparatus of claim 1, wherein the array of molecules are single molecule magnets (SMMs).

3. The apparatus of claim 1, wherein the first probe tip is capable of conveying the non-direct-current time-varying polarized electron current to the individual molecule of the away of molecules.

4. The apparatus of claim 1, wherein the second probe tip is operable to convey electron current primarily from the individual molecule of the away of molecules.

5. The apparatus of claim 1, further comprising:
a first current filter coupled with the probe assembly and at least capable of conveying polarized electron current; and
a second current filter coupled with the probe assembly and at least capable of conveying oppositely polarized electron current.

6. The apparatus of claim 5, wherein the first and second current filters include half-metal electron sources.

7. The apparatus of claim 1, wherein the first and second probe tips are electrically coupled with the individual molecule, of the array of molecules, by electron current tunneling.

8. The apparatus of claim 1, wherein the source of polarized electron current and the source of oppositely polarized electron current include half-metal electron sources.

9. A system comprising:
a substrate having disposed thereon an array of molecules;
a probe assembly having a first probe tip and a second probe tip, the assembly at least capable of being positioned in relation to the array of molecules such that the first and the second probe tips are selectively coupled electrically with individual molecules of the away of molecules;
a source of polarized electron current;
a source of oppositely polarized electron current;
a switch mechanism having a switch, the switch mechanism for applying a non-direct-current time-varying polarized electron current to the first probe tip by at least selectively coupling either the source of polarized electron current or the source of oppositely polarized electron current with the first probe tip; and
a control logic at least capable of manipulating the switch mechanism so as to convey the non-direct-current time-varying polarized electron current to the first probe tip.

10. The system of claim 9, wherein the away of molecules comprises single molecule magnets (SMMs).

11. The system of claim 9, wherein the source of polarized electron current and the source of oppositely polarized electron current include half-metal materials.

12. The system of claim 9, wherein the control logic is at least capable of writing information to the array of molecules by manipulating the switch mechanism.

13. The system of claim 9, wherein the control logic comprises one of a controller integrated circuit (IC), a microcontroller IC, or an application specific integrated circuit (ASIC).

\* \* \* \* \*

UNITED STATES PATENT AND TRADEMARK OFFICE
CERTIFICATE OF CORRECTION

PATENT NO.        : 7,746,689 B2                                                Page 1 of 1
APPLICATION NO.   : 11/291802
DATED             : June 29, 2010
INVENTOR(S)       : Eric C. Hannah It is certified that error appears in the above-identified patent and that said Letters Patent is hereby corrected as shown below:

Col. 9, claim 4, line 3: ". . . away of molecules . . ."
Correct: ". . . array of molecules . . ."

Col. 10, claim 9, line 2: ". . . away of molecules . . ."
Correct: ". . . array of molecules . . ."

Col. 10, claim 10, line 1: ". . . away of molecules . . ."
Correct: ". . . array of molecules . . ."

Signed and Sealed this

Sixteenth Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,746,689 B2  Page 1 of 1
APPLICATION NO. : 11/291802
DATED : June 29, 2010
INVENTOR(S) : Eric C. Hannah It is certified that error appears in the above-identified patent and that said Letters Patent is hereby corrected as shown below:

Column 9, line 7 (claim 4, line 3): ". . . away of molecules . . ."
Correct: ". . . array of molecules . . ."

Column 10, lines 2-3 (claim 9, line 2): ". . . away of molecules . . ."
Correct: ". . . array of molecules . . ."

Column 10, line 15 (claim 10, line 1): ". . . away of molecules . . ."
Correct: ". . . array of molecules . . ."

This certificate supersedes the Certificate of Correction issued November 16, 2010.

Signed and Sealed this

Fourteenth Day of December, 2010

David J. Kappos
*Director of the United States Patent and Trademark Office*